(12) United States Patent
Yamaguchi et al.

(10) Patent No.: US 9,978,481 B2
(45) Date of Patent: May 22, 2018

(54) OXIDE SUPERCONDUCTING THIN FILM WIRE AND METHOD FOR PRODUCING SAME

(71) Applicant: SUMITOMO ELECTRIC INDUSTRIES, LTD., Osaka-shi, Osaka (JP)

(72) Inventors: Takashi Yamaguchi, Osaka (JP); Tatsuoki Nagaishi, Osaka (JP); Masaya Konishi, Osaka (JP); Kotaro Ohki, Osaka (JP); Genki Honda, Osaka (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 0 days. days.

(21) Appl. No.: 15/123,729

(22) PCT Filed: Mar. 4, 2015

(86) PCT No.: PCT/JP2015/056296
§ 371 (c)(1),
(2) Date: Sep. 6, 2016

(87) PCT Pub. No.: WO2015/133505
PCT Pub. Date: Sep. 11, 2015

(65) Prior Publication Data
US 2017/0011824 A1    Jan. 12, 2017

(30) Foreign Application Priority Data

Mar. 7, 2014  (JP) ................................. 2014-045047
Mar. 7, 2014  (JP) ................................. 2014-045064

(51) Int. Cl.
*H01B 12/00*  (2006.01)
*H01B 12/04*  (2006.01)
(Continued)

(52) U.S. Cl.
CPC ......... *H01B 12/04* (2013.01); *H01B 13/0036* (2013.01); *H01F 6/06* (2013.01); *H01L 39/143* (2013.01); *H01L 39/2461* (2013.01)

(58) Field of Classification Search
CPC ... H01B 12/04; H01B 13/0036; H01B 13/009
(Continued)

(56) References Cited

U.S. PATENT DOCUMENTS 4,971,948 A * 11/1990 Dam .................... H01L 39/2464
216/65
5,567,330 A * 10/1996 Dorothy ............ H01L 23/49888
216/18
(Continued)

FOREIGN PATENT DOCUMENTS

CN    101036241 A    9/2007
CN    103026426 A    4/2013
(Continued)

OTHER PUBLICATIONS

English-language translation of JP 2013-122065 attached.

*Primary Examiner* — William H Mayo, III
(74) *Attorney, Agent, or Firm* — Drinker Biddle & Reath LLP

(57) ABSTRACT

An oxide superconducting thin film wire includes a metal substrate, a laminate, and a Cu stabilizing layer. The metal substrate includes a supporting base material and a conductive layer located on the supporting base material. The conductive layer includes a Cu layer serving as an internal layer and a biaxially orientated surface layer. The laminate includes a buffer layer, an oxide superconducting layer, and a Ag stabilizing layer stacked on the metal substrate in this order from the metal substrate. The Cu stabilizing layer is formed so as to surround the laminate and the metal substrate. At least one of the Cu stabilizing layer and the Ag stabilizing layer is formed so as to be in contact with at least
(Continued)

a portion of the conductive layer of the metal substrate and be electrically conductive with the conductive layer of the metal substrate.

16 Claims, 4 Drawing Sheets

(51) Int. Cl.
*H01F 6/06* (2006.01)
*H01L 39/14* (2006.01)
*H01L 39/24* (2006.01)
*H01B 13/00* (2006.01)

(58) Field of Classification Search
USPC ............... 174/254, 126.1, 126.2, 125.1
See application file for complete search history.

(56) References Cited

U.S. PATENT DOCUMENTS

| | | | |
|---|---|---|---|
| 6,951,985 B1* | 10/2005 | Lemelson | H01L 39/14 174/125.1 |
| 7,774,035 B2* | 8/2010 | Lee | H01L 39/143 428/930 |
| 9,697,930 B2* | 7/2017 | Takemoto | H01L 39/143 |
| 2002/0144838 A1* | 10/2002 | Fritzemeier | C30B 23/02 174/125.1 |
| 2007/0145100 A1* | 6/2007 | Suzuki | H01L 39/143 228/101 |
| 2009/0093370 A1* | 4/2009 | Kobayashi | H01F 6/06 505/211 |
| 2009/0137400 A1* | 5/2009 | Hahakura | C23C 14/06 505/234 |
| 2016/0125977 A1* | 5/2016 | Machi | H01B 12/04 174/125.1 |

FOREIGN PATENT DOCUMENTS

| | | | | |
|---|---|---|---|---|
| EP | 2 770 513 A1 * | 11/2012 | | H01B 12/06 |
| JP | H07-37444 A | 2/1995 | | |
| JP | 2003-308745 A | 10/2003 | | |
| JP | 2005-044636 A | 2/2005 | | |
| JP | 2007-287629 A | 11/2007 | | |
| JP | 2009-218008 A * | 9/2009 | | H01B 12/06 |
| JP | 2009-218008 A | 9/2009 | | |
| JP | 2011-040378 A | 2/2011 | | |
| JP | 2011-113664 A | 6/2011 | | |
| JP | 2013-012406 A | 1/2013 | | |
| JP | WO2013/077387 A1 * | 5/2013 | | H01B 13/00 |
| JP | 2013-122065 A | 6/2013 | | |
| WO | WO 2013/077387 A | 5/2013 | | |

* cited by examiner

OXIDE SUPERCONDUCTING THIN FILM WIRE AND METHOD FOR PRODUCING SAME

TECHNICAL FIELD

The present invention relates to an oxide superconducting thin film wire and a method for producing the oxide superconducting thin film wire.

BACKGROUND ART

Since the discovery of high-temperature superconducting materials having superconductivity at a temperature of liquid nitrogen, high-temperature superconducting wires aimed at applications to electric power devices such as cables, current limiters, and magnets have been actively developed. In particular, oxide superconducting thin film wires in which a thin layer made of a rare earth-based oxide superconducting material (hereafter also referred to as an "oxide superconducting layer") is formed on a substrate have been receiving attention.

Such an oxide superconducting thin film wire is generally produced by forming an oxide superconducting layer made of, for example, an oxide superconducting material represented by REBCO (REBa$_2$Cu$_3$O$_{7-\delta}$: RE refers to "rare earth") on a wide metal substrate with biaxial orientation and then cutting (slitting) the substrate into a predetermined width (e.g., PTL 1 to PTL 4).

Specifically, first, an oxide layer made of Y$_2$O$_3$ (yttrium oxide), YSZ (yttria stabilized zirconia), CeO$_2$ (cerium dioxide), or the like is formed on a wide metal substrate as a buffer layer by, for example, a sputtering method.

Then, an oxide superconducting layer is formed on the buffer layer by a physical vapor deposition method (PVD method) such as a pulse laser deposition method (PLD method), a sputtering method, or an ion plating method or a chemical vapor deposition method (CVD method) such as a metal organic decomposition method (MOD method).

Then, a silver (Ag) stabilizing layer is formed on the oxide superconducting layer by a sputtering method or the like. Through these processes, a wide oxide superconducting wire is produced.

Then, the wide oxide superconducting wire is subjected to slitting so as to have a predetermined width by using a mechanical slitter, a laser slitter, or the like.

FIG. 4 is a perspective view schematically illustrating an example of a structure of the thus-slit oxide superconducting thin film wire. An oxide superconducting thin film wire 1 includes a metal substrate B, a buffer layer 14, an oxide superconducting layer 15, and a Ag stabilizing layer 16. As illustrated in FIG. 4, a clad substrate including a stainless (SUS) layer 11 serving as a supporting base material, a copper (Cu) layer 12 serving as an orientated layer, and a nickel (Ni) layer 13 serving as an oxidation prevention layer is widely used as the metal substrate B. Herein, the Cu layer 12 and the Ni layer 13 constitute a conductive layer of the metal substrate B.

CITATION LIST

Patent Literature

PTL 1: Japanese Unexamined Patent Application Publication No. 07-037444
PTL 2: Japanese Unexamined Patent Application Publication No. 2003-308745
PTL 3: Japanese Unexamined Patent Application Publication No. 2007-287629
PTL 4: Japanese Unexamined Patent Application Publication No. 2013-12406

SUMMARY OF INVENTION

Technical Problem

However, when an electric current higher than the critical current (Ic) flows through the oxide superconducting layer 15, the oxide superconducting layer 15 is not maintained in the superconducting state and is changed into the normal conducting state. As a result, high resistance is generated in the oxide superconducting layer 15 to generate heat, and finally the oxide superconducting layer 15 may be broken (burned out).

Therefore, even when an electric current (overcurrent) higher than Ic temporarily flows, the overcurrent needs to be prevented from flowing through the oxide superconducting layer. Thus, an oxide superconducting thin film wire 1 illustrated in FIG. 4 is provided by disposing not only the Ag stabilizing layer 16, but also a Cu stabilizing layer 17.

In these stabilizing layers, the electrical resistance decreases as the thickness increases. Therefore, an increase in the temperature due to the overcurrent is suppressed, which decreases the probability of occurrence of burnout and achieves a quick return to a superconducting state.

However, it becomes more difficult to bend an oxide superconducting thin film wire as the thickness of the stabilizing layer increases. As a result, the feature of the oxide superconducting thin film wire is lost and the production cost increases.

Accordingly, it is an object of the present invention to provide an oxide superconducting thin film wire that can sufficiently endure a large overcurrent while ease of bending of the oxide superconducting thin film wire is sufficiently maintained, and a method for producing the oxide superconducting thin film wire.

Solution to Problem

An aspect of the present invention relates to an oxide superconducting thin film wire including a metal substrate, a laminate, and a Cu stabilizing layer,
wherein the metal substrate includes a supporting base material and a conductive layer located on the supporting base material,
the conductive layer includes a Cu layer serving as an internal layer and a biaxially orientated surface layer,
the laminate includes a buffer layer, an oxide superconducting layer, and a Ag stabilizing layer stacked on the metal substrate in this order from the metal substrate,
the Cu stabilizing layer is formed so as to surround the laminate and the metal substrate, and
at least one of the Cu stabilizing layer and the Ag stabilizing layer is formed so as to be in contact with at least a portion of the conductive layer of the metal substrate and be electrically conductive with the conductive layer of the metal substrate.

Another aspect of the present invention relates to a method for producing an oxide superconducting thin film wire, the method including:
a laminate-forming step of forming a laminate by forming a buffer layer, an oxide superconducting layer, and a Ag stabilizing layer on a wide metal substrate in this order from the metal substrate, the metal substrate including a supporting base material and a conductive layer that is located on the supporting base material and includes a Cu layer serving as an internal layer and a biaxially orientated surface layer;

a slitting step of cutting the metal substrate and the laminate into a predetermined width;

a conductive layer-exposing step of exposing a portion of the conductive layer of the metal substrate from the slit metal substrate and laminate; and a Cu stabilizing layer-forming step of forming a Cu stabilizing layer so that the Cu stabilizing layer surrounds the laminate and the metal substrate, wherein in the Cu stabilizing layer-forming step, the Cu stabilizing layer is formed so as to be in contact with the exposed portion of the conductive layer of the metal substrate and be electrically conductive with the conductive layer.

A still another aspect of the present invention relates to a method for producing an oxide superconducting thin film wire, the method including:

a laminate-forming step of forming a laminate by forming a buffer layer and an oxide superconducting layer on a wide metal substrate in this order from the metal substrate, the metal substrate including a supporting base material and a conductive layer that is located on the supporting base material and includes a Cu layer serving as an internal layer and a biaxially orientated surface layer;

a slitting step of cutting the metal substrate and the laminate into a predetermined width;

a conductive layer-exposing step of forming at least one through hole that extends from a surface of the slit laminate to the conductive layer of the metal substrate;

a Ag stabilizing layer-forming step of farming a Ag stabilizing layer on the laminate; and a Cu stabilizing layer-forming step of forming a Cu stabilizing layer so that the Cu stabilizing layer surrounds the metal substrate and the laminate on which the Ag stabilizing layer has been formed, wherein in the Ag stabilizing layer-forming step, the Ag stabilizing layer is formed so as to be in contact with the conductive layer of the metal substrate through the through hole and be electrically conductive with the conductive layer of the metal substrate.

A still another aspect of the present invention relates to a method for producing an oxide superconducting thin film wire, the method including:

a laminate-forming step of forming a laminate by forming a buffer layer and an oxide superconducting layer on a wide metal substrate in this order from the metal substrate, the metal substrate including a supporting base material and a conductive layer that is located on the supporting base material and includes a Cu layer serving as an internal layer and a biaxially orientated surface layer;

a slitting step of cutting the metal substrate and the laminate into a predetermined width;

a conductive layer-exposing step of exposing at least a portion of the Cu layer of the metal substrate from side end faces of the slit laminate and metal substrate;

a Ag stabilizing layer-forming step of forming a Ag stabilizing layer on the laminate and the metal substrate; and a Cu stabilizing layer-forming step of forming a Cu stabilizing layer so that the Cu stabilizing layer further surrounds the laminate and metal substrate on which the Ag stabilizing layer has been formed, wherein in the Ag stabilizing layer-forming step, the Ag stabilizing layer is formed so that the Ag stabilizing layer surrounds the laminate and the metal substrate to achieve electrical conduction between the exposed portion of the Cu layer of the metal substrate and the Ag stabilizing layer.

Advantageous Effects of Invention

According to the present invention, there can be provided an oxide superconducting thin film wire that can sufficiently endure a large overcurrent while ease of bending of the oxide superconducting thin film wire is sufficiently maintained, and a method for producing the oxide superconducting thin film wire.

DESCRIPTION OF EMBODIMENTS

[Description of Embodiments According to the Present Invention]

First, the contents of embodiments according to the present invention will be listed and described.

(1) An oxide superconducting thin film wire according to an embodiment of the present invention includes a metal substrate, a laminate, and a Cu stabilizing layer. The metal substrate includes a supporting base material and a conductive layer located on the supporting base material. The conductive layer includes a Cu layer serving as an internal layer and a biaxially orientated surface layer. The laminate includes a buffer layer, an oxide superconducting layer, and a Ag stabilizing layer stacked on the metal substrate in this order from the metal substrate. The Cu stabilizing layer is formed so as to surround the laminate and the metal substrate. At least one of the Cu stabilizing layer and the Ag stabilizing layer is formed so as to be in contact with at least a portion of the conductive layer of the metal substrate and be electrically conductive with the conductive layer of the metal substrate.

Figure 1:
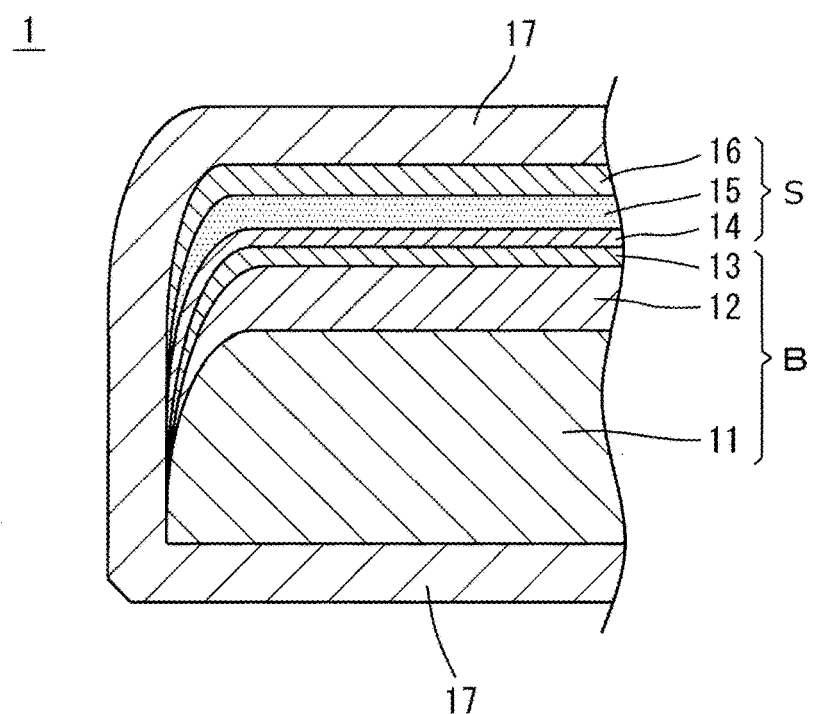
FIG. 1 is a cross-sectional view schematically illustrating a state of a cut end portion of a slit oxide superconducting thin film wire.

To solve the above problems, the present inventors have observed a structure of known oxide superconducting thin film wires in detail. As a result, it has been found that, as illustrated in FIG. 1, a Cu layer 12 and a Ni layer 13 of a metal substrate B are covered with a buffer layer 14 serving as an insulator in a cut end portion of a slit oxide superconducting thin film wire 1, and a Cu stabilizing layer 17 is formed while this state is maintained. This may be because in a slitting process, distortion is generated in the substrate due to contact of a blade when a mechanical slitter is employed or dross is generated as a result of formation of an alloy at a cut surface when a laser slitter is employed, and thus the exposure of the Cu layer 12 and the Ni layer 13 is inhibited in the cut end portion.

The present inventors have considered that if the Cu layer 12 and the Ni layer 13 constituting the conductive layer of the metal substrate B are electrically conductive with a stabilizing layer such as the Cu stabilizing layer 17 or the Ag stabilizing layer 16, the Cu layer 12 and the Ni layer 13 can also be made to function as stabilizing layers. In other words, they have become aware that if the Cu layer 12 and the Ni layer 13 that have been simply used to form a biaxially orientated layer and an oxidation prevention layer in known oxide superconducting thin film wires can be made to function as a current-carrying path for an overcurrent in an oxide superconducting thin film wire, a large overcurrent can be sufficiently endured without increasing the thickness of the stabilizing layer. Specifically, at least one of the Cu stabilizing layer and the Ag stabilizing layer is formed so as to be in contact with at least a portion of the conductive layer of the metal substrate and be electrically conductive with the conductive layer of the metal substrate, whereby an overcurrent is also caused to flow to the metal substrate, which can sufficiently suppress the generation of heat.

(2) In the oxide superconducting thin film wire, preferably, at least one through hole is formed so as to extend from a surface of the laminate to the conductive layer of the metal substrate, and the Cu stabilizing layer is formed so as to be in contact with the conductive layer of the metal substrate through the through hole and be electrically conductive with the conductive layer of the metal substrate. A through hole extending to the conductive layer of the metal substrate is formed in the laminate obtained by stacking the buffer layer, the oxide superconducting layer, and the Ag stabilizing layer, and the Cu stabilizing layer is formed so as to be in contact with the conductive layer of the metal substrate through the through hole and be electrically conductive with the conductive layer. Therefore, electrical conduction can be achieved between the Cu layer of the metal substrate and the Cu stabilizing layer, and an overcurrent can be caused to flow at a smaller electrical resistance. The Cu stabilizing layer may be in contact with a surface layer of the conductive layer of the metal substrate or may be in contact with the Cu layer serving as an internal layer. When the Cu stabilizing layer is in contact with the surface layer of the conductive layer, electrical conduction is achieved between the Cu stabilizing layer and the Cu layer serving as an internal layer via the surface layer at a sufficiently small electrical resistance.

(3) In the oxide superconducting thin film wire, the Cu stabilizing layer may be in contact with at least a portion of a side end face of the Cu layer of the metal substrate and may be electrically conductive with the Cu layer of the metal substrate. At least a portion of a side end face of the Cu layer of the metal substrate is exposed, and the Cu stabilizing layer is formed so that electrical conduction is achieved between the Cu layer of the metal substrate and the Cu stabilizing layer via the exposed portion. Thus, an overcurrent can also be caused to flow to the metal substrate, which can sufficiently suppress the generation of heat.

(4) In the oxide superconducting thin film wire, at least one through hole may be formed so as to extend from a surface of the laminate to the conductive layer of the metal substrate, and the Ag stabilizing layer may be formed so as to be in contact with the conductive layer of the metal substrate through the through hole and be electrically conductive with the conductive layer of the metal substrate. The through hole extends to the conductive layer of the metal substrate, and the Ag stabilizing layer having high conductivity is formed so as to be in contact with the conductive layer of the metal substrate through the through hole and be electrically conductive with the conductive layer. Therefore, electrical conduction can be achieved between the Cu layer of the metal substrate and the Ag stabilizing layer, and an overcurrent can be caused to flow at a smaller electrical resistance. The Ag stabilizing layer may be in contact with a surface layer of the conductive layer of the metal substrate or may be in contact with the Cu layer serving as an internal layer. When the Ag stabilizing layer is in contact with the surface layer of the conductive layer, electrical conduction is achieved between the Ag stabilizing layer and the Cu layer serving as an internal layer via the surface layer at a sufficiently small electrical resistance.

(5) In the oxide superconducting thin film wire, the Ag stabilizing layer may be in contact with at least a portion of a side end face of the Cu layer of the metal substrate and may be electrically conductive with the Cu layer of the metal substrate. At least a portion of a side end face of the Cu layer of the metal substrate is exposed, and the Ag stabilizing layer is formed so that electrical conduction is achieved between the Cu layer of the metal substrate and the Ag stabilizing layer via the exposed portion. Thus, an overcurrent can also be caused to flow to the metal substrate, which can sufficiently suppress the generation of heat.

(6) A method for producing an oxide superconducting thin film wire according to an embodiment of the present invention includes a laminate-forming step of forming a laminate by forming a buffer layer, an oxide superconducting layer, and a Ag stabilizing layer on a wide metal substrate in this order from the metal substrate, the metal substrate including a supporting base material and a conductive layer that is located on the supporting base material and includes a Cu layer serving as an internal layer and a biaxially orientated surface layer; a slitting step of cutting the metal substrate and the laminate into a predetermined width; a conductive layer-exposing step of exposing a portion of the conductive layer of the metal substrate from the slit metal substrate and laminate; and a Cu stabilizing layer-forming step of forming a Cu stabilizing layer so that the Cu stabilizing layer surrounds the laminate and the metal substrate. In the Cu stabilizing layer-forming step, the Cu stabilizing layer is formed so as to be in contact with the exposed portion of the conductive layer of the metal substrate and be electrically conductive with the conductive layer.

Thus, a method for producing an oxide superconducting thin film wire can be provided in which the oxide superconducting thin film wires according to (1) to (3) can be efficiently produced at low cost with high quality.

(7) In the method for producing an oxide superconducting thin film wire, the conductive layer-exposing step may be a conductive layer-exposing step of forming at least one through hole that extends from a surface of the slit laminate to the conductive layer of the metal substrate, and in the Cu stabilizing layer-forming step, the Cu stabilizing layer may be formed so as to be in contact with the conductive layer of the metal substrate through the through hole and be electrically conductive with the conductive layer of the metal substrate. By forming the through hole in the laminate, the conductive layer of the metal substrate can be exposed with certainty. This achieves electrical conduction between the Cu stabilizing layer and the conductive layer of the metal substrate at a sufficiently small electrical resistance. The Cu stabilizing layer may be brought into contact with the surface layer of the metal substrate by forming a through hole that extends to the surface layer or may be brought into contact with the Cu layer of the metal substrate by forming a through hole that extends to the Cu layer.

(8) In the method for producing an oxide superconducting thin film wire, the conductive layer-exposing step may be a conductive layer-exposing step of exposing at least a portion of the Cu layer of the metal substrate from side end faces of the slit laminate and metal substrate, and the Cu stabilizing layer-forming step may be a Cu stabilizing layer-forming step of forming the Cu stabilizing layer so that the Cu stabilizing layer surrounds the laminate and the metal substrate to achieve electrical conduction between the exposed portion of the Cu layer of the metal substrate and the Cu stabilizing layer. The side end face of the Cu layer of the metal substrate can be exposed by a simple method, and thus electrical conduction can be achieved between the Cu stabilizing layer and the Cu layer of the metal substrate at a sufficiently small electrical resistance.

(9) In the method for producing an oxide superconducting thin film wire, the conductive layer-exposing step is preferably a Cu layer-exposing step of polishing side end faces of the slit laminate and metal substrate to expose at least a portion of the Cu layer of the metal substrate. The specific method for exposing the Cu layer is not particularly limited as long as an insulator that covers the Cu layer of the metal substrate can be removed with certainty. Polishing is preferred because the Cu layer can be exposed with certainty through a simple process.

(10) Another method for producing an oxide superconducting thin film wire according to an embodiment of the present invention includes a laminate-forming step of forming a laminate by forming a buffer layer and an oxide superconducting layer on a wide metal substrate in this order from the metal substrate, the metal substrate including a supporting base material and a conductive layer that is located on the supporting base material and includes a Cu layer serving as an internal layer and a biaxially orientated surface layer; a slitting step of cutting the metal substrate and the laminate into a predetermined width; a conductive layer-exposing step of forming at least one through hole that extends from a surface of the slit laminate to the conductive layer of the metal substrate; a Ag stabilizing layer-forming step of forming a Ag stabilizing layer on the laminate; and a Cu stabilizing layer-forming step of forming a Cu stabilizing layer so that the Cu stabilizing layer surrounds the metal substrate and the laminate on which the Ag stabilizing layer has been formed. In the Ag stabilizing layer-forming step, the Ag stabilizing layer is formed so as to be in contact with the conductive layer of the metal substrate through the through hole and be electrically conductive with the conductive layer of the metal substrate.

In this production method, the Ag stabilizing layer having high conductivity is brought into contact with the surface layer or the Cu layer of the conductive layer of the metal substrate through the through hole, whereby electrical conduction can be achieved between the surface layer or the Cu layer of the metal substrate and the Ag stabilizing layer at a sufficiently small electrical resistance. In the case where the Cu stabilizing layer is formed by performing plating, the degradation of the oxide superconducting layer due to a plating solution can be prevented by covering, with the Ag stabilizing layer, the end face of the oxide superconducting layer exposed in the through hole before the formation of the Cu stabilizing layer. Thus, a method for producing an oxide superconducting thin film wire can be provided in which the oxide superconducting thin film wires according to (1) and (4) can be efficiently produced at low cost with high quality.

(11) A still another method for producing an oxide superconducting thin film wire according to an embodiment of the present invention includes a laminate-forming step of forming a laminate by forming a buffer layer and an oxide superconducting layer on a wide metal substrate in this order from the metal substrate, the metal substrate including a supporting base material and a conductive layer that is located on the supporting base material and includes a Cu layer serving as an internal layer and a biaxially orientated surface layer; a slitting step of cutting the metal substrate and the laminate into a predetermined width; a conductive layer-exposing step of exposing at least a portion of the Cu layer of the metal substrate from side end faces of the slit laminate and metal substrate; a Ag stabilizing layer-forming step of forming a Ag stabilizing layer on the laminate and the metal substrate; and a Cu stabilizing layer-forming step of forming a Cu stabilizing layer so that the Cu stabilizing layer further surrounds the laminate and metal substrate on which the Ag stabilizing layer has been formed. In the Ag stabilizing layer-forming step, the Ag stabilizing layer is formed so that the Ag stabilizing layer surrounds the laminate and the metal substrate to achieve electrical conduction between the exposed portion of the Cu layer of the metal substrate and the Ag stabilizing layer.

In this production method, the Ag stabilizing layer having high conductivity is brought into contact with the exposed Cu layer of the metal substrate, whereby electrical conduction can be achieved between the Cu layer of the metal substrate and the Ag stabilizing layer at a sufficiently small electrical resistance. In the case where the Cu stabilizing layer is formed by performing plating, the degradation of the oxide superconducting layer due to a plating solution can be prevented by covering, with the Ag stabilizing layer, the end face of the oxide superconducting layer exposed at the side end face of the metal substrate before the formation of the Cu stabilizing layer. Thus, a method for producing an oxide superconducting thin film wire can be provided in which the oxide superconducting thin film wires according to (1) and (5) can be efficiently produced at low cost with high quality.

(12) In the method for producing an oxide superconducting thin film wire, the conductive layer-exposing step is preferably a Cu layer-exposing step of polishing side end faces of the slit laminate and metal substrate to expose at least a portion of the Cu layer of the metal substrate. The specific method for exposing the Cu layer is not particularly limited as long as an insulator that covers the Cu layer of the metal substrate can be removed with certainty.

Polishing is preferred because the Cu layer can be exposed with certainty through a simple process.

[Details of Embodiments of the Present Invention]

Hereafter, an embodiment of the oxide superconducting thin film wire according to the present invention will be described with reference to the attached drawings. In these drawings, the same or corresponding components are denoted by the same reference numerals and repetitive descriptions thereof are omitted. The present invention is not limited to these examples and is indicated by the scope of the claims. The present invention is intended to embrace equivalents of the scope of the claims and all modifications within the scope of the claims.

1. Structure of Oxide Superconducting Thin Film Wire

Figure 4:
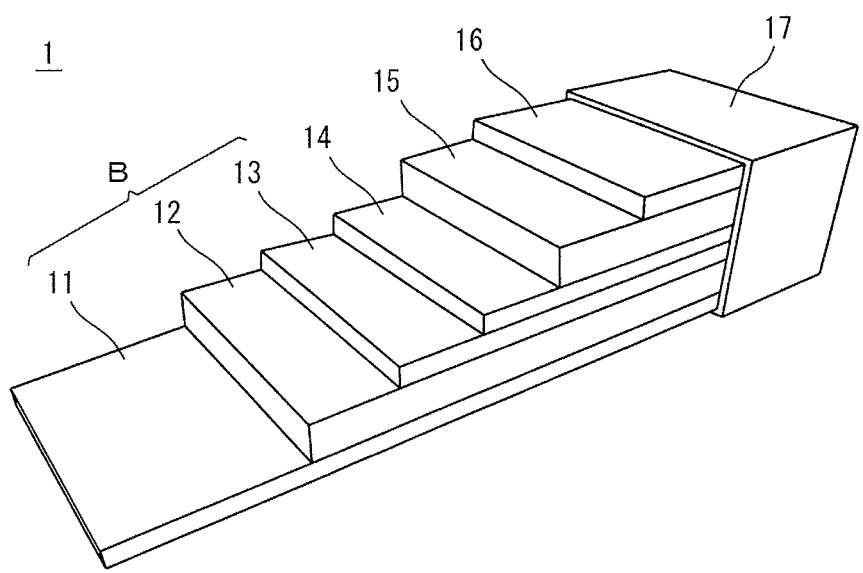
FIG. 4 is a perspective view schematically illustrating an example of a structure of an oxide superconducting thin film wire.

First, the structure of an oxide superconducting thin film wire will be described. The basic structure of the oxide superconducting thin film wire according to this embodiment is the same as that of the oxide superconducting thin film wire illustrated in FIG. 4, except that at least one of the Cu stabilizing layer and the Ag stabilizing layer is in contact with at least a portion of the conductive layer of the metal substrate so as to be electrically conductive with the conductive layer of the metal substrate.

Figure 2A:
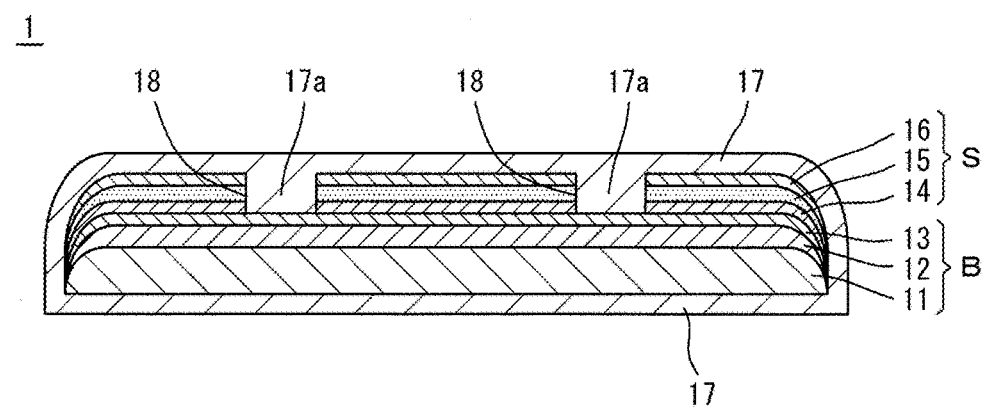
FIG. 2A is a cross-sectional view schematically illustrating an example of a structure of an oxide superconducting thin film wire according to an embodiment of the present invention.

An oxide superconducting thin film wire according to this embodiment will be described with reference to FIG. 2A. In the oxide superconducting thin film wire 1 illustrated in FIG. 2A, 17a denotes a part of the Cu stabilizing layer, 18 denotes a through hole, and S denotes a laminate obtained by stacking a buffer layer 14, an oxide superconducting layer 15, and a Ag stabilizing layer 16. In this oxide superconducting thin film wire 1, the through hole 18 penetrates the laminate S, and the part 17a of the Cu stabilizing layer is in contact with a surface layer (specifically, a Ni layer 13) of the conductive layer of the metal substrate B through the through hole 18. As illustrated in FIG. 2A, the part 17a of the Cu stabilizing layer is in contact with the surface layer (specifically, the Ni layer 13) of the conductive layer of the metal substrate B, and thus a Cu layer 12 of the metal substrate B is electrically conductive with the Cu stabilizing layer 17 at a sufficiently small electrical resistance via the Ni layer 13. Thus, the Cu layer 12, which has hardly functioned as a current-carrying path for an overcurrent, can be sufficiently made to function as a current-carrying path. Consequently, even when the thickness of the stabilizing layer is not increased, a large overcurrent can be endured.

(Modification 1)

Figure 2B:
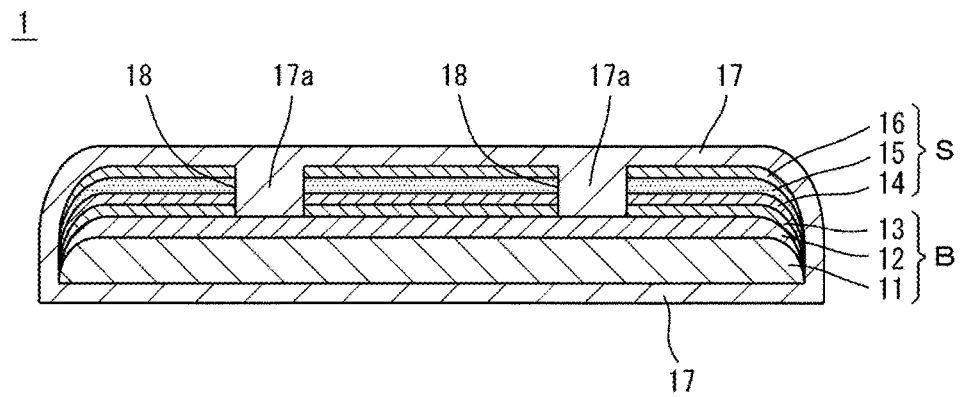
FIG. 2B is a cross-sectional view schematically illustrating an example of a structure of an oxide superconducting thin film wire according to an embodiment of the present invention.

The Cu stabilizing layer 17 may be in contact with the Cu layer 12 of the conductive layer of the metal substrate B. The oxide superconducting thin film wire 1 illustrated in FIG. 2B is different from the oxide superconducting thin film wire 1 in FIG. 2A in that the through hole 18 reaches the Cu layer 12 of the metal substrate B and the part 17a of the Cu stabilizing layer 17 is in direct contact with the Cu layer 12. When the Cu stabilizing layer 17 is in direct contact with the Cu layer 12, the Cu layer 12 is electrically conductive with the Cu stabilizing layer at a more sufficiently small electrical resistance. Thus, the Cu layer 12, which has hardly functioned as a current-carrying path for an overcurrent, can be sufficiently made to function as a current-carrying path. Consequently, even when the thickness of the stabilizing layer is not increased, a large overcurrent can be endured.

In other words, since the Cu layer 12 is covered with the buffer layer 14, which is an insulator, as illustrated in FIG. 1, the Cu layer 12 is not electrically connected to the oxide superconducting layer 15. As described above, this is because in a slitting process, distortion is generated in the substrate due to contact of a blade when a mechanical slitter is employed or dross is generated as a result of formation of an alloy at a cut surface when a laser slitter is employed, and thus the Cu layer 12 is not exposed at side end portions. Therefore, if the through hole 18 is not formed, the Cu layer 12 is electrically conductive with the Cu stabilizing layer 17 through the SUS layer 11 having not so high conductivity and is electrically conductive with the oxide superconducting layer 15 in an indirect manner. This makes it difficult to allow the Cu layer 12 to function as a current-carrying path for an overcurrent. In contrast, when the through hole 18 is formed as illustrated in FIG. 2A and FIG. 2B, the Cu layer 12 of the metal substrate is electrically conductive with the Cu stabilizing layer 17 at a sufficiently small electrical resistance as described above. Thus, the Cu layer 12 can be sufficiently made to function as a current-carrying path.

The number of through holes 18 is not particularly limited. A plurality of through holes 18 may be formed in the longitudinal direction and the width direction of the oxide superconducting thin film wire. In the case where a through groove having a rectangular shape when viewed in plan is formed as the through hole 18, the length of the groove is not particularly limited. The width of the through hole 18 having a rectangular shape when viewed in plan or the diameter of the through hole 18 having a circular shape when viewed in plan is appropriately determined in consideration of the width of the oxide superconducting thin film wire, the number of the through holes, the assumed value of an overcurrent, and the formation of Cu inside the through hole 18 so that a sufficiently large electric current can be caused to flow and a decrease in Ic is sufficiently suppressed. In general, the width or diameter of the through hole 18 is preferably 0.1 to 0.5 mm and more preferably 0.2 to 0.4 mm.

(Modification 2)

Figure 2C:
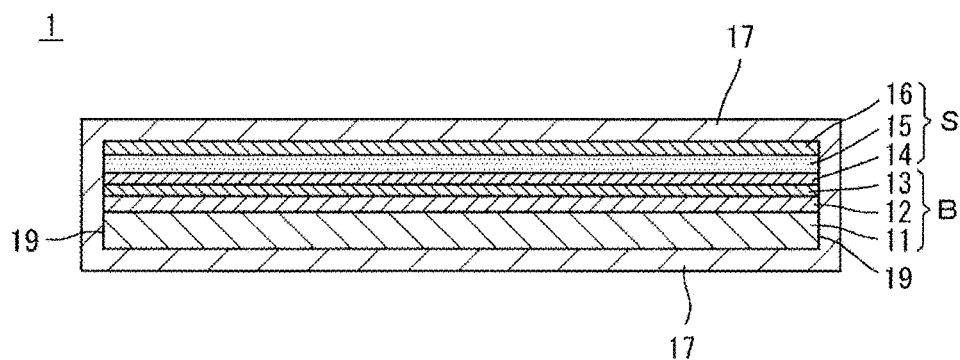
FIG. 2C is a cross-sectional view schematically illustrating an example of a structure of an oxide superconducting thin film wire according to an embodiment of the present invention.

An oxide superconducting thin film wire 1 illustrated in FIG. 2C is different from the oxide superconducting thin film wires 1 in FIG. 2A and FIG. 2B in that the Cu stabilizing layer 17 is in contact with side end faces 19 of the Cu layer 12 of the metal substrate B. In the oxide superconducting thin film wire 1 according to this embodiment, the Cu layer 12 is exposed at the side end portions of the metal substrate B, and the Cu stabilizing layer 17 is in contact with the side end faces 19 of the Cu layer 12. Thus, the Cu layer 12 of the metal substrate B is electrically conductive with the Cu stabilizing layer 17 at a sufficiently small electrical resistance. When the Cu layer 12 is electrically conductive with the Cu stabilizing layer 17 at a sufficiently small electrical resistance, the Cu layer 12, which has hardly functioned as a current-carrying path for an overcurrent, can be sufficiently made to function as a current-carrying path. Consequently, even when the thickness of the stabilizing layer is not increased, a large overcurrent can be endured.

As described above, since the Cu layer 12 of the metal substrate B is covered with the buffer layer 14, which is an insulator, and is not exposed at the side end portions after the slitting process, the Cu layer 12 is not electrically connected to the oxide superconducting layer 15. Therefore, if the Cu layer 12 is not exposed at the side end portions of the metal substrate B, the Cu layer 12 is electrically conductive with the Cu stabilizing layer 17 through the SUS layer 11 having not so high conductivity and is electrically conductive with the oxide superconducting layer 15 in an indirect manner. This makes it difficult to allow the Cu layer 12 to function as a current-carrying path for an overcurrent. In contrast, when the Cu layer 12 is exposed as illustrated in FIG. 2C, the Cu layer 12 is electrically conductive with the Cu stabilizing layer 17 at a sufficiently small electrical resistance as described above. Thus, the Cu layer 12 can be sufficiently made to function as a current-carrying path.

The position and number of exposed portions of the Cu layer 12 are not particularly limited. The exposed portion may be located at one of the sides of the Cu layer 12 or both sides of the Cu layer 12 as illustrated in FIG. 2C. The size (area) and number of the exposed portions may be set in accordance with, for example, the assumed value of an overcurrent.

(Modification 3)

Figure 3A:
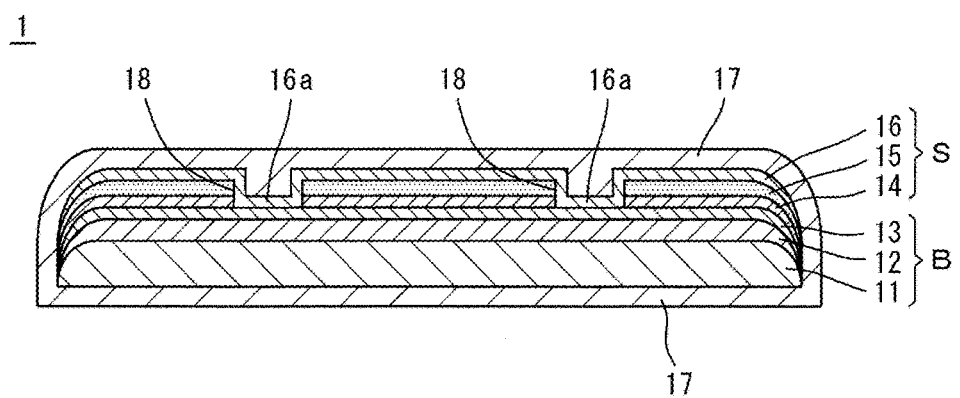
FIG. 3A is a cross-sectional view schematically illustrating an example of a structure of an oxide superconducting thin film wire according to an embodiment of the present invention.

An oxide superconducting thin film wire 1 illustrated in FIG. 3A is different from the oxide superconducting thin film wire 1 in FIG. 2A in that a part 16a of the Ag stabilizing layer is in contact with a surface layer (specifically, the Ni layer 13) of the conductive layer of the metal substrate B through the through hole 18. In the through hole, the part 16a of the Ag stabilizing layer is formed so as to be in contact with the Ni layer 13, and a Cu stabilizing layer 17 is formed thereon. When the Ag stabilizing layer 16 having high conductivity is in contact with the surface layer (specifically, the Ni layer 13) of the metal substrate B, the surface layer being exposed in the through hole, the Cu layer 12 of the metal substrate B is electrically conductive with the Ag stabilizing layer 16 via the Ni layer 13 at a sufficiently small electrical resistance. Thus, the Cu layer 12, which has hardly functioned as a current-carrying path for an overcurrent, can be sufficiently made to function as a current-carrying path. Consequently, even when the thickness of the stabilizing layer is not increased, a large overcurrent can be endured.

(Modification 4)

Figure 3B:
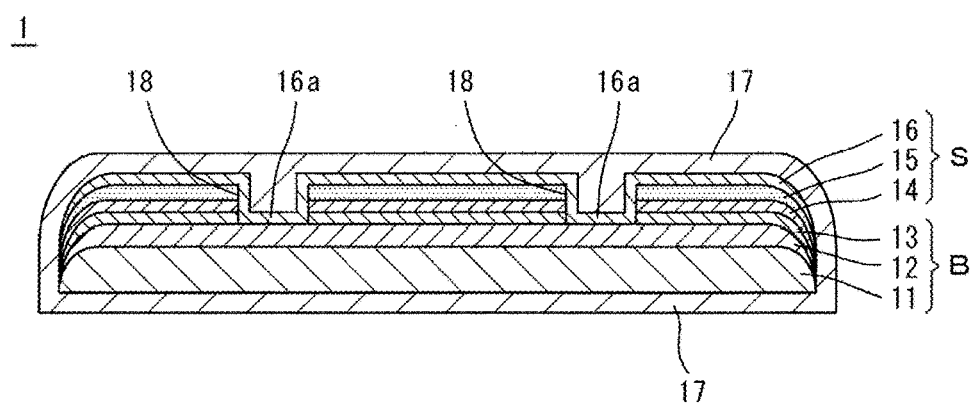
FIG. 3B is a cross-sectional view schematically illustrating an example of a structure of an oxide superconducting thin film wire according to an embodiment of the present invention.

The Ag stabilizing layer may be in direct contact with the Cu layer of the conductive layer of the metal substrate B. An oxide superconducting thin film wire 1 illustrated in FIG. 3B is different from the oxide superconducting thin film wire 1 in FIG. 3A in that the through hole 18 reaches the Cu layer 12 of the metal substrate B and the part 16a of the Ag stabilizing layer 16 is in direct contact with the Cu layer 12. In the through hole, the part 16a of the Ag stabilizing layer is formed so as to be in contact with the Cu layer 12, and a Cu stabilizing layer 17 is formed thereon. When the Ag stabilizing layer 16 having high conductivity is in direct contact with the Cu layer 12, the Cu layer 12 is electrically conductive with the Ag stabilizing layer 16 at a more sufficiently small electrical resistance. Thus, the Cu layer 12, which has hardly functioned as a current-carrying path for an overcurrent, can be sufficiently made to function as a current-carrying path. Consequently, even when the thickness of the stabilizing layer is not increased, a large overcurrent can be endured.

As described above, since the Cu layer 12 of the metal substrate B is covered with the buffer layer 14, which is an insulator, and is not exposed at the side end portions after the slitting process, the Cu layer 12 is not electrically connected to the oxide superconducting layer 15. Therefore, if the through hole 18 is not formed, the Cu layer 12 is electrically conductive with the Cu stabilizing layer 17 and the Ag stabilizing layer 16 through the SUS layer 11 having not so high conductivity and is electrically conductive with the oxide superconducting layer 15 in an indirect manner. This makes it difficult to allow the Cu layer 12 to function as a current-carrying path for an overcurrent. In contrast, when the through hole 18 is formed as illustrated in FIGS. 3A and 3B, the Cu layer 12 of the metal substrate is electrically conductive with the Ag stabilizing layer 16 at a sufficiently small electrical resistance as described above. Thus, the Cu layer 12 can be sufficiently made to function as a current-carrying path.

The number of through holes 18 is not particularly limited. A plurality of through holes 18 may be formed in the longitudinal direction and the width direction of the oxide superconducting thin film wire. In the case where a through groove having a rectangular shape when viewed in plan is formed as the through hole 18, the length of the groove is not particularly limited. The width of the through hole 18 having a rectangular shape when viewed in plan or the diameter of the through hole 18 having a circular shape when viewed in plan is appropriately determined in consideration of the width of the oxide superconducting thin film wire, the number of the through holes, the assumed value of an overcurrent, and the formation of Ag inside the through hole 18 so that a sufficiently large electric current can be caused to flow and a decrease in Ic is sufficiently suppressed. In general, the width or diameter of the through hole 18 is preferably 0.1 to 0.5 mm and more preferably 0.2 to 0.4 mm.

(Modification 5)

Figure 3C:
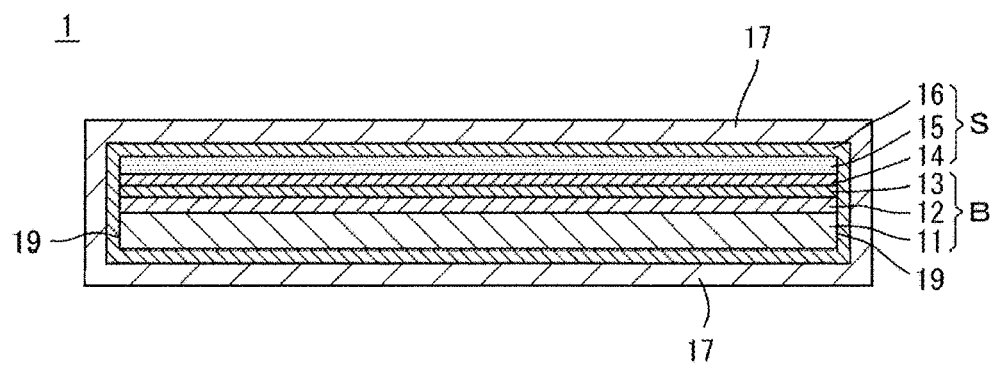
FIG. 3C is a cross-sectional view schematically illustrating an example of a structure of an oxide superconducting thin film wire according to an embodiment of the present invention.

An oxide superconducting thin film wire 1 illustrated in FIG. 3C is different from the oxide superconducting thin film wires 1 in FIG. 3A and FIG. 3B in that the Ag stabilizing layer 16 is in contact with the side end faces 19 of the Cu layer 12 of the metal substrate B. In the oxide superconducting thin film wire 1 according to this embodiment, the Cu layer 12 is exposed at the side end portions of the metal substrate B, and the Ag stabilizing layer 16 having high conductivity is in contact with the side end faces 19 of the Cu layer 12. Therefore, the Cu layer 12 of the metal substrate B is electrically conductive with the Ag stabilizing layer 16 at a sufficiently small electrical resistance. Thus, the Cu layer 12, which has hardly functioned as a current-carrying path for an overcurrent, can be sufficiently made to function as a current-carrying path. Consequently, even when the thickness of the stabilizing layer is not increased, a large overcurrent can be endured.

As described above, since the Cu layer 12 of the metal substrate B is covered with the buffer layer 14, which is an insulator, and is not exposed at the side end portions after the slitting process, the Cu layer 12 is not electrically connected to the oxide superconducting layer 15. Therefore, if the Cu layer 12 is not exposed at the side end portions of the metal substrate B, the Cu layer 12 is electrically conductive with the Cu stabilizing layer 17 and the Ag stabilizing layer 16 through the SUS layer 11 having not so high conductivity and is electrically conductive with the oxide superconducting layer 15 in an indirect manner. This makes it difficult to allow the Cu layer 12 to function as a current-carrying path for an overcurrent. In contrast, when the Cu layer 12 is exposed as illustrated in FIG. 3C, the Cu layer 12 is electrically conductive with the Ag stabilizing layer 16 at a sufficiently small electrical resistance as described above. Thus, the Cu layer 12 can be sufficiently made to function as a current-carrying path.

The position and number of exposed portions of the Cu layer 12 are not particularly limited. The exposed portion may be located at one of the sides of the Cu layer 12 or both sides of the Cu layer 12 as illustrated in FIG. 3C. The size (area) and number of the exposed portions may be set in accordance with, for example, the assumed value of an overcurrent.

2. Members for Oxide Superconducting Thin Film Wire (1) Metal Substrate

The metal substrate B includes a supporting base material and a conductive layer located on the supporting base material. The metal substrate B is a biaxially orientated metal substrate with a Cu layer 12 and is made of, for example, a SUS/Cu/Ni clad material. For example, a metal substrate including a SUS layer 11 with a thickness of about 100 µm, a Cu layer 12 with a thickness of 20 to 50 µm, and a Ni layer 13 with a thickness of 2 to 3 µm is preferably used. Herein, the SUS layer is a supporting base material, and the conductive layer includes the Cu layer 12 serving as an internal layer and the Ni layer 13 serving as a surface layer. The Cu layer 12 and the Ni layer 13 of the conductive layer have higher conductivity than the SUS layer 11. Such a metal substrate B is produced by, for example, laminating Cu on the SUS layer 11 by rolling and then subjecting the surface of the Cu layer 12 to Ni plating.

(2) Buffer Layer

The buffer layer 14 has a multilayer structure including, in the order from the metal substrate B, a seed layer for epitaxially growing a buffer layer while keeping the orientation of the metal substrate, a barrier layer (diffusion prevention layer) for preventing an element such as Ni of the metal substrate B from diffusing toward the oxide superconducting layer 15, and a cap layer (lattice matched layer) having a lattice match with the oxide superconducting layer 15 and used for epitaxially growing the oxide superconducting layer. For example, the buffer layer 14 preferably has a three-layer structure including $Y_2O_3$ with a thickness of 0.1 to 0.2 µm, YSZ with a thickness of 0.2 to 0.4 µm, and $CeO_2$ with a thickness of about 0.1 µm.

(3) Oxide Superconducting Layer

The oxide superconducting layer 15 is formed of a rare earth-based oxide superconducting material biaxially orientated by epitaxial growth. Specifically, for example, GdBCO ($GdBa_2Cu_3O_{7-\delta}$) is preferably used. The thickness of the layer is not particularly limited and is appropriately determined in accordance with the required performance. The thickness is, for example, 1 to 5 µm. The material for the oxide superconducting layer 15 is not limited to GdBCO, but may be an oxide superconducting material represented by REBCO ($REBa_2Cu_3O_{7-\delta}$: RE refers to a "rare earth element").

(4) Stabilizing Layer

The stabilizing layer is constituted by a Ag stabilizing layer 16 and a Cu stabilizing layer 17.

The Ag stabilizing layer 16 is disposed on the oxide superconducting layer 15 or disposed so as to cover the peripheral surfaces of the metal substrate B and the laminate with a thickness of, for example, 5 to 10 µm. Silver has high conductivity and is a metal that exhibits good adhesion to the oxide superconducting material and copper. Therefore, silver is suitably used as a material for a stabilizing layer that covers the oxide superconducting layer 15 or the peripheral surfaces of the slit metal substrate and laminate and that passes through the through hole 18.

The Cu stabilizing layer 17 is disposed outside the Ag stabilizing layer 16 so as to cover the entire peripheral surface of the oxide superconducting thin film wire with a thickness of, for example, 10 to 50 µm. Copper has high conductivity and is cheaper than silver. Therefore, copper is suitably used as a material for a stabilizing layer that covers the peripheral surfaces of the slit metal substrate and laminate and that passes through the through hole 18.

As described above, in the oxide superconducting thin film wire 1 according to an embodiment of the present invention, the Cu stabilizing layer 17 or the Ag stabilizing layer 16 is in contact with the conductive layer of the metal substrate B. More specifically, as illustrated in FIG. 2A, FIG. 2B, FIG. 3A, and FIG. 3B, the part 17a of the Cu stabilizing layer 17 or the part 16a of the Ag stabilizing layer 16 is in contact with the surface layer (specifically, the Ni layer 13) or the Cu layer 12 of the metal substrate B through the through hole 18. Alternatively, as illustrated in FIG. 2C and FIG. 3C, the Cu stabilizing layer 17 or the Ag stabilizing layer 16 may be in contact with at least a portion of the side end face 19 of the Cu layer 12 of the metal substrate B.

3. Method for Producing Oxide Superconducting Thin Film Wire

Next, a method for producing the oxide superconducting thin film wire 1 according to this embodiment will be described below using the oxide superconducting thin film wire 1 in FIG. 2A as an example in the process order.

(1) Formation of Buffer Layer

First, a buffer layer 14 is formed on a metal substrate B. Specifically, a metal substrate B having a width of, for example, 10 mm or more is used, and a $Y_2O_3$ layer, a YSZ layer, and a $CeO_2$ layer are formed on a Ni layer 13 in this order. The buffer layer 14 is normally formed by a PVD method such as a sputtering method.

(2) Formation of Oxide Superconducting Layer

Then, an oxide superconducting layer 15 is formed on the buffer layer 14 by epitaxial growth. The oxide superconducting layer 15 can be formed by a PVD method, a MOD method, or the like as described above. Examples of the PVD method include a PLD (pulse laser deposition) method, a sputtering method, a vacuum deposition method, and an ion plating method. A PLD method is preferably employed because a thin film having the same composition ratio as the target can be easily formed.

After the film formation, annealing is performed in a predetermined atmosphere at a predetermined temperature for a predetermined time to form an oxide superconducting layer 15. Specifically, for example, high-temperature low-oxygen annealing is performed in an atmosphere with an $O_2$ concentration of 100 ppm at 800° C. for 120 minutes, and then oxygen annealing is performed in an atmosphere with an $O_2$ concentration of 98% at 550° C. for 120 minutes.

(3) Formation of Ag Stabilizing Layer

Then, a Ag stabilizing layer 16 is formed on the oxide superconducting layer 15 by a sputtering method such as a DC sputtering method. After the formation of the Ag stabilizing layer 16, a heat treatment is performed in an oxygen atmosphere when necessary.

(4) Slitting

Then, slitting is performed by cutting, into a predetermined width, the laminate S obtained by stacking the buffer layer 14, the oxide superconducting layer 15, and the Ag stabilizing layer 16 and the metal substrate B using the above-described mechanical slitter, laser slitter, or the like.

(5) Exposure Process for Conductive Layer

Then, a portion of the conductive layer of the metal substrate B is exposed from the slit metal substrate B and laminate S. In the oxide superconducting thin film wire 1 illustrated in FIG. 2A, a predetermined number of through holes 18 that have a predetermined size and that penetrate the laminate S including the Ag stabilizing layer 16, the oxide superconducting layer 15, and the buffer layer 14 so as to reach a surface layer (specifically, the Ni layer 13) of the metal substrate B are formed at predetermined positions by laser machining or the like.

(6) Formation of Cu Stabilizing Layer

Then, a Cu stabilizing layer 17 is formed by plating on a peripheral surface of the oxide superconducting thin film wire in which the slitting has been performed and the through holes 18 have been formed. Herein, Cu plating is also performed in the through holes 18 formed in (5) Exposure process for conductive layer described above, and consequently a part 17a of the Cu stabilizing layer 17 that penetrates each of the through holes 18 is formed.

The plating is performed under the following conditions, for example. Plating solution: Copper sulfate pentahydrate ($CuSO_4 \cdot 5H_2O$) 75 g/L

| | |
|---|---|
| Sulfuric acid ($H_2SO_4$) | 190 g/L |
| Potassium chloride (KCl) | 75 g/L |
| Brightener | 0.001 g/L |

Current density: 5 A/dm$^2$ (Production method for Modification 1)

The method for producing the oxide superconducting thin film wire 1 (Modification 1) illustrated in FIG. 2B is different from the method for producing the oxide superconducting thin film wire 1 in FIG. 2A in that through holes 18 that penetrate the Ni layer 13 together with the laminate S so as to reach the Cu layer 12 are formed in (5) Exposure process for conductive layer in the method for producing the oxide superconducting thin film wire 1 in FIG. 2A. Other processes are the same and the descriptions thereof are omitted. As described above, the thicknesses of the Cu layer 12 and the Ni layer 13 of the conductive layer of the metal substrate B are, for example, 20 to 50 µm and 2 to 3 µm, respectively. Since the thickness of the Cu layer 12 is sufficiently larger than that of the Ni layer 13, the through holes are easily formed so as to reach the Cu layer 12.

(Production method for Modification 2)

The method for producing the oxide superconducting thin film wire 1 (Modification 2) illustrated in FIG. 2C is different from the method for producing the oxide superconducting thin film wire 1 in FIG. 2A in that the side end faces 19 of the Cu layer 12 of the metal substrate B are exposed without forming the through holes in (5) Exposure process for conductive layer in the method for producing the oxide superconducting thin film wire 1 in FIG. 2A. In the exposure process for the Cu layer 12 at the side end faces of the metal substrate B, a covering material such as dross that covers the side end faces of the metal substrate B is removed to expose the Cu layer 12 at the side end faces of the metal substrate B.

The exposure process may be performed by a method in which the side end portions of the laminate S are cut off using a special cutting machine equipped with a blade capable of cutting the side end portions of the laminate S without distorting the substrate. However, a method for removing only the covering material by performing polishing is preferably employed because the covering material can be removed with certainty without degrading the quality of the wire to expose the Cu layer. Specific examples of the polishing method include grinding with abrasive grains, mechanochemical polishing, and polishing with sandpaper or a polishing belt as described above.

(Production method for Modification 3)

Next, a method for producing the oxide superconducting thin film wire 1 (Modification 3) illustrated in FIG. 3A will be described below in the process order.

(1) Formation of Buffer Layer and (2) Formation of Oxide Superconducting Layer

A buffer layer 14 and an oxide superconducting layer 15 are formed on the metal substrate B to form a laminate in the same manner as in the case of the method for producing the oxide superconducting thin film wire 1 illustrated in FIG. 2A. After the formation of the oxide superconducting layer 15, a Ag stabilizing layer 16 may be formed thereon to form a laminate, but the Ag stabilizing layer 16 is not necessarily formed.

(3) Slitting

Then, slitting is performed by cutting, into a predetermined width, the laminate and the metal substrate B using the above-described mechanical slitter, laser slitter, or the like.

(4) Exposure Process for Conductive Layer

Then, a portion of the conductive layer of the metal substrate B is exposed from the slit laminate and metal substrate B. In the method for producing the oxide superconducting thin film wire 1 illustrated in FIG. 3A, a predetermined number of through holes 18 that have a predetermined size and that penetrate the laminate so as to reach the surface layer of the metal substrate B are formed at predetermined positions by laser machining or the like.

(5) Formation of Ag Stabilizing Layer

Then, a Ag stabilizing layer 16 is formed on the laminate by a sputtering method such as a DC sputtering method. Thus, the Ag stabilizing layer is formed on the oxide superconducting layer 15 while at the same time a Ag layer is formed in the through holes 18 formed in (4) Exposure process for conductive layer described above. Consequently, a part 16a of the Ag stabilizing layer 16 is formed through each of the through holes 18.

(6) Formation of Cu Stabilizing Layer

Then, a Cu stabilizing layer 17 is formed by plating on a peripheral surface of the oxide superconducting thin film wire 1. Thus, the Cu stabilizing layer 17 is formed so as to surround the laminate S and the metal substrate B. Herein, the Cu stabilizing layer 17 is also formed on the part 16a of the Ag stabilizing layer formed in the through hole. In this production method, the end face of the oxide superconducting layer 15 exposed in the through hole is covered with the Ag stabilizing layer 16. Therefore, the degradation of the oxide superconducting layer 15 due to a plating solution can be prevented during the formation of the Cu stabilizing layer. The plating conditions are the same as those described in the method for producing the oxide superconducting thin film wire 1 illustrated in FIG. 2A.

(Production method for Modification 4)

The method for producing the oxide superconducting thin film wire 1 (Modification 4) illustrated in FIG. 3B is different from the method for producing the oxide superconducting thin film wire 1 (Modification 3) in FIG. 3A in that through holes 18 that penetrate the Ni layer 13 together with the laminate so as to reach the Cu layer 12 are formed in (4) Exposure process for conductive layer in the production method for Modification 3. Other processes are the same and the descriptions thereof are omitted. As described above, the thicknesses of the Cu layer 12 and the Ni layer 13 of the conductive layer of the metal substrate B are, for example, 20 to 50 µm and 2 to 3 µm, respectively. Since the thickness of the Cu layer 12 is sufficiently larger than that of the Ni layer 13, the through holes are easily formed so as to reach the Cu layer 12.

(Production Method for Modification 5)

Next, a method for producing the oxide superconducting thin film wire 1 (Modification 5) illustrated in FIG. 3C will be described below in the process order.

(1) Formation of Buffer Layer and (2) Formation of Oxide Superconducting Layer

A buffer layer 14 and an oxide superconducting layer 15 are formed on the metal substrate B to form a laminate in the same manner as in the case of the method for producing the oxide superconducting thin film wire 1 illustrated in FIG. 3A. After the formation of the oxide superconducting layer 15, a Ag stabilizing layer 16 may be formed thereon to form a laminate, but the Ag stabilizing layer 16 is not necessarily formed.

(3) Slitting

Then, slitting is performed by cutting, into a predetermined width, the laminate and the metal substrate B using the above-described mechanical slitter, laser slitter, or the like.

(4) Exposure Process for Conductive Layer

Then, a portion of the conductive layer of the metal substrate B is exposed from the slit laminate and metal substrate B. In the method for producing the oxide superconducting thin film wire 1 (Modification 5) illustrated in FIG. 3C, a covering material such as dross that covers the side end portions of the metal substrate B is removed to expose the Cu layer 12 at the side end portions of the metal substrate B. The exposure process may be performed by a method in which the side end portions of the laminate are cut off using a special cutting machine equipped with a blade capable of cutting the side end portions of the laminate without distorting the substrate. However, a method for removing only the covering material by performing polishing is preferably employed because the covering material can be removed with certainty without degrading the quality of the wire to expose the Cu layer. Specific examples of the polishing method include grinding with abrasive grains, mechanochemical polishing, and polishing with sandpaper or a polishing belt as described above.

(5) Formation of Ag Stabilizing Layer

Then, a Ag stabilizing layer 16 is formed so as to surround the laminate and the metal substrate B by a sputtering method such as a DC sputtering method. Thus, the Ag stabilizing layer is formed on the oxide superconducting layer 15 while at the same time the Ag stabilizing layer 16 is also formed on the side end faces 19 of the Cu layer 12 exposed at the side end portions of the metal substrate B in (4) Exposure process for conductive layer described above.

(6) Formation of Cu Stabilizing Layer

Then, a Cu stabilizing layer 17 is formed by plating on a peripheral surface of the oxide superconducting thin film wire 1 in which the Ag stabilizing layer has been formed. Herein, the end faces of the oxide superconducting layer 15 exposed at the side end faces 19 of the metal substrate B are covered with the Ag stabilizing layer 16. Therefore, the degradation of the oxide superconducting layer 15 due to a plating solution can be prevented during the formation of the Cu stabilizing layer. The plating conditions are the same as those described in the method for producing the oxide superconducting thin film wire 1 illustrated in FIG. 2A.

Table 1 collectively shows the preferred structure (material, thickness), film formation (production) method, and role (function) of each of the components.

EXPERIMENTAL EXAMPLES

Next, the present invention will be more specifically described based on Experimental Examples.

1. Production of Oxide Superconducting Thin Film Wire

First, a SUS/Cu/Ni clad material (SUS layer: 100 μm, Cu layer: 48 μm, and Ni layer: 2 μm) having a thickness of 150 μm, a width of 30 mm, and a length of 1 m was prepared for a metal substrate. Then, a buffer layer ($Y_2O_3$: 0.1 μm, YSZ: 0.3 μm, and $CeO_2$: 0.1 μm) having a three-layer structure with a thickness of 0.5 μm was formed on the metal substrate by a sputtering method.

Subsequently, a GdBCO oxide superconducting layer (thickness: 4 μm) was formed by a PLD method, and then a Ag stabilizing layer (thickness: 5 μm) was formed by a sputtering method to form a laminate. Thus, a wide oxide superconducting thin film wire was produced. The wide oxide superconducting thin film wire was subjected to slitting so as to have a width of 4 mm Subsequently, two through grooves (width: 0.2 mm) that penetrated the laminate from the surface of the Ag stabilizing layer of the slit oxide superconducting thin film wire to the Cu layer of the metal substrate were formed by laser machining.

Subsequently, a plating treatment was performed at a current density of 5 $A/dm^2$ for 10 minutes using the plating solution with the above-described formula to form a Cu stabilizing layer having a thickness of 50 μm. Thus, an oxide superconducting thin film wire of Experimental Example 1 was produced. Herein, the through grooves were also filled with Cu as a result of the plating treatment.

An oxide superconducting thin film wire of Experimental Example 2 was produced in the same manner as above, except that the side end faces of the slit oxide superconducting thin film wire were polished with a #200 sandpaper to expose the Cu layer of the metal substrate.

An oxide superconducting thin film wire of Experimental Example 3 was produced in the same manner as above, except that the through grooves were not formed in the slit oxide superconducting thin film wire and the side end faces were not polished.

The Ic value of each of the produced wires was 200 A.

2. Evaluation

An electric current with a rectangular wave of 13 msec was then applied to the oxide superconducting thin film wire of each of Experimental Examples. An electric current at which the oxide superconducting thin film wire was broken (burned out) was measured. As a result, the following was confirmed. Burnout occurred at 350 A in Experimental

TABLE 1

| | Material | Thickness (μm) | Film formation method | Function |
|---|---|---|---|---|
| Stabilizing layer | Cu | 10 to 50 | Plating | Prevention of damage to oxide superconducting layer |
| | Ag | 5 to 10 | Sputtering | |
| Oxide superconducting layer | GdBCO | 1 to 5 | PLD method | |
| Buffer layer | $CeO_2$ | 0.1 | RF sputtering | Lattice match with oxide superconducting layer |
| | YSZ | 0.2 to 0.4 | | Prevention of diffusion |
| | $Y_2O_3$ | 0.1 to 0.2 | | Seed layer |
| Clad substrate | Ni | 2 to 3 | Plating | Prevention of oxidation |
| | Cu | 20 to 50 | Rolling | Orientated layer |
| | SUS | 100 | | Supporting base material |

Example 3 whereas burnout did not occur up to 500 A in Experimental Examples 1 and 2 even though the oxide superconducting thin film wires had the same size and structure. This shows that the oxide superconducting thin film wires in Experimental Examples 1 and 2 could endure an overcurrent larger than or equal to 1.4 times the overcurrent in Experimental Example 3.

The same result was also obtained when the stabilizing layer brought into contact with the conductive layer of the metal substrate was changed from the Cu stabilizing layer to the Ag stabilizing layer. Furthermore, the same result was also obtained when the oxide superconducting layer was changed from the GdBCO oxide superconducting layer to the YBCO oxide superconducting layer.

INDUSTRIAL APPLICABILITY

The present invention is capable of providing a superconducting thin film wire that includes, for example, a rare earth-based oxide superconducting layer and that endures a larger overcurrent without losing features of the superconducting thin film wire (e.g., without making it difficult to bend the superconducting thin film wire). The present invention contributes to encouraging practical use of the superconducting wire.

REFERENCE SIGNS LIST 1 oxide superconducting thin film wire
11 SUS layer
12 Cu layer
13 Ni layer
14 buffer layer
15 oxide superconducting layer
16 Ag stabilizing layer
16a part of Ag stabilizing layer
17 Cu stabilizing layer
17a part of Cu stabilizing layer
18 through hole
19 side end face
B metal substrate
S laminate

The invention claimed is:

1. An oxide superconducting thin film wire comprising a metal substrate, a laminate, and a Cu stabilizing layer,
   wherein the metal substrate includes a supporting base material and a conductive layer located on the supporting base material,
   the conductive layer includes a Cu layer serving as an internal layer and a biaxially orientated surface layer,
   the laminate includes a buffer layer, an oxide superconducting layer, and a Ag stabilizing layer stacked on the metal substrate in this order from the metal substrate,
   the Cu stabilizing layer is formed so as to surround the laminate and the metal substrate, and
   at least one of the Cu stabilizing layer and the Ag stabilizing layer is formed so as to be in contact with at least a portion of the conductive layer of the metal substrate and be electrically conductive with the conductive layer of the metal substrate.

2. The oxide superconducting thin film wire according to claim 1, wherein at least one through hole is formed so as to extend from a surface of the laminate to the conductive layer of the metal substrate, and the Cu stabilizing layer is formed so as to be in contact with the conductive layer of the metal substrate through the through hole and be electrically conductive with the conductive layer of the metal substrate.

3. The oxide superconducting thin film wire according to claim 2, wherein a width or diameter of the through hole is 0.1 to 0.5 mm.

4. The oxide superconducting thin film wire according to claim 1, wherein the Cu stabilizing layer is in contact with at least a portion of a side end face of the Cu layer of the metal substrate and is electrically conductive with the Cu layer of the metal substrate.

5. The oxide superconducting thin film wire according to claim 1, wherein at least one through hole is formed so as to extend from a surface of the laminate to the conductive layer of the metal substrate, and the Ag stabilizing layer is formed so as to be in contact with the conductive layer of the metal substrate through the through hole and be electrically conductive with the conductive layer of the metal substrate.

6. The oxide superconducting thin film wire according to claim 3, wherein a width or diameter of the through hole is 0.1 to 0.5 mm.

7. The oxide superconducting thin film wire according to claim 1, wherein the Ag stabilizing layer is in contact with at least a portion of a side end face of the Cu layer of the metal substrate and is electrically conductive with the Cu layer of the metal substrate.

8. A method for producing an oxide superconducting thin film wire, the method comprising:
   a laminate-forming step of forming a laminate by forming a buffer layer, an oxide superconducting layer, and a Ag stabilizing layer on a wide metal substrate in this order from the metal substrate, the metal substrate including a supporting base material and a conductive layer that is located on the supporting base material and includes a Cu layer serving as an internal layer and a biaxially orientated surface layer;
   a slitting step of cutting the metal substrate and the laminate into a predetermined width;
   a conductive layer-exposing step of exposing a portion of the conductive layer of the metal substrate from the slit metal substrate and laminate; and
   a Cu stabilizing layer-forming step of forming a Cu stabilizing layer so that the Cu stabilizing layer surrounds the laminate and the metal substrate,
   wherein in the Cu stabilizing layer-forming step, the Cu stabilizing layer is formed so as to be in contact with the exposed portion of the conductive layer of the metal substrate and be electrically conductive with the conductive layer.

9. The method for producing an oxide superconducting thin film wire according to claim 8, wherein the conductive layer-exposing step is a conductive layer-exposing step of forming at least one through hole that extends from a surface of the slit laminate to the conductive layer of the metal substrate, and
   in the Cu stabilizing layer-forming step, the Cu stabilizing layer is formed so as to be in contact with the conductive layer of the metal substrate through the through hole and be electrically conductive with the conductive layer of the metal substrate.

10. The method for producing an oxide superconducting thin film wire according to claim 9, wherein a width or diameter of the through hole is 0.1 to 0.5 mm.

11. The method for producing an oxide superconducting thin film wire according to claim 8, wherein the conductive layer-exposing step is a conductive layer-exposing step of exposing at least a portion of the Cu layer of the metal substrate from side end faces of the slit laminate and metal substrate, and the Cu stabilizing layer-forming step is a Cu stabilizing layer-forming step of forming the Cu stabilizing layer so that the Cu stabilizing layer surrounds the laminate and the metal substrate to achieve electrical conduction between the exposed portion of the Cu layer of the metal substrate and the Cu stabilizing layer.

12. The method for producing an oxide superconducting thin film wire according to claim 11, wherein in the conductive layer-exposing step, side end faces of the slit laminate and metal substrate are polished to expose at least a portion of the Cu layer of the metal substrate.

13. A method for producing an oxide superconducting thin film wire, the method comprising:
- a laminate-forming step of forming a laminate by forming a buffer layer and an oxide superconducting layer on a wide metal substrate in this order from the metal substrate, the metal substrate including a supporting base material and a conductive layer that is located on the supporting base material and includes a Cu layer serving as an internal layer and a biaxially orientated surface layer;
- a slitting step of cutting the metal substrate and the laminate into a predetermined width;
- a conductive layer-exposing step of forming at least one through hole that extends from a surface of the slit laminate to the conductive layer of the metal substrate;
- a Ag stabilizing layer-forming step of forming a Ag stabilizing layer on the laminate; and
- a Cu stabilizing layer-forming step of forming a Cu stabilizing layer so that the Cu stabilizing layer surrounds the metal substrate and the laminate on which the Ag stabilizing layer has been formed,
- wherein in the Ag stabilizing layer-forming step, the Ag stabilizing layer is formed so as to be in contact with the conductive layer of the metal substrate through the through hole and be electrically conductive with the conductive layer of the metal substrate.

14. The method for producing an oxide superconducting thin film wire according to claim 13, wherein a width or diameter of the through hole is 0.1 to 0.5 mm.

15. A method for producing an oxide superconducting thin film wire, the method comprising:
- a laminate-forming step of forming a laminate by forming a buffer layer and an oxide superconducting layer on a wide metal substrate in this order from the metal substrate, the metal substrate including a supporting base material and a conductive layer that is located on the supporting base material and includes a Cu layer serving as an internal layer and a biaxially orientated surface layer;
- a slitting step of cutting the metal substrate and the laminate into a predetermined width;
- a conductive layer-exposing step of exposing at least a portion of the Cu layer of the metal substrate from side end faces of the slit laminate and metal substrate;
- a Ag stabilizing layer-forming step of forming a Ag stabilizing layer on the laminate and the metal substrate; and
- a Cu stabilizing layer-forming step of forming a Cu stabilizing layer so that the Cu stabilizing layer further surrounds the laminate and metal substrate on which the Ag stabilizing layer has been formed,
- wherein in the Ag stabilizing layer-forming step, the Ag stabilizing layer is formed so that the Ag stabilizing layer surrounds the laminate and the metal substrate to achieve electrical conduction between the exposed portion of the Cu layer of the metal substrate and the Ag stabilizing layer.

16. The method for producing an oxide superconducting thin film wire according to claim 15, wherein in the conductive layer-exposing step, side end faces of the slit laminate and metal substrate are polished to expose at least a portion of the Cu layer of the metal substrate.

* * * * *

UNITED STATES PATENT AND TRADEMARK OFFICE
CERTIFICATE OF CORRECTION

| | |
|---|---|
| PATENT NO. | : 9,978,481 B2 |
| APPLICATION NO. | : 15/123729 |
| DATED | : May 22, 2018 |
| INVENTOR(S) | : Takashi Yamaguchi et al. |

Page 1 of 1

It is certified that error appears in the above-identified patent and that said Letters Patent is hereby corrected as shown below:

In the Claims

In Claim 6, Line 17, "claim 3," should read as "claim 5,"

Signed and Sealed this
Thirty-first Day of July, 2018

Andrei Iancu
*Director of the United States Patent and Trademark Office*